United States Patent
Umehara et al.

(10) Patent No.: US 9,171,899 B2
(45) Date of Patent: Oct. 27, 2015

(54) SAPPHIRE STRUCTURE WITH A CONCAVE PORTION INCLUDING A METAL SUBSTRUCTURE AND METHOD FOR PRODUCING THE SAME

(71) Applicant: KYOCERA Corporation, Kyoto-shi, Kyoto (JP)

(72) Inventors: Motohiro Umehara, Yasu (JP); Yoshinori Kubo, Omihachiman (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 14/461,623

(22) Filed: Aug. 18, 2014

(65) Prior Publication Data

US 2015/0115414 A1 Apr. 30, 2015

(30) Foreign Application Priority Data

Oct. 30, 2013 (JP) .................................. 2013-225829

(51) Int. Cl.
| | |
|---|---|
| *H01L 29/04* | (2006.01) |
| *H01L 21/441* | (2006.01) |
| *H01L 21/465* | (2006.01) |
| *B05D 3/12* | (2006.01) |
| *B06B 1/00* | (2006.01) |
| *H01L 41/00* | (2013.01) |

(52) U.S. Cl.
CPC . *H01L 29/04* (2013.01); *B06B 1/00* (2013.01); *H01L 21/441* (2013.01); *H01L 21/465* (2013.01); *H01L 41/00* (2013.01)

(58) Field of Classification Search
CPC ..... H01L 29/04; H01L 21/441; H01L 21/465; B05D 3/0254; B05D 3/12; B05D 3/02
USPC ............. 257/627, 773, 774, 668, 98, E33.074
IPC ..... H01L 29/04, 21/441, 21/465; B05D 3/0254, B05D 3/12, 3/02
See application file for complete search history.

(56) References Cited

U.S. PATENT DOCUMENTS

| | | | | |
|---|---|---|---|---|
| 4,151,574 | A | * | 4/1979 | Gerkema et al. ............... 360/313 |
| 5,652,557 | A | * | 7/1997 | Ishikawa ....................... 333/243 |
| 6,590,760 | B1 | | 7/2003 | Fujii |
| 8,222,153 | B2 | * | 7/2012 | Lienhart et al. ............... 438/703 |
| 2004/0089869 | A1 | * | 5/2004 | Uemura .......................... 257/85 |

(Continued)

FOREIGN PATENT DOCUMENTS

| JP | 07-106459 A | 4/1995 |
|---|---|---|
| JP | 2000-344584 A | 12/2000 |

(Continued)

OTHER PUBLICATIONS

International Report on Patentability and Written Opinion of the Japanese Patent Office issued in International application No. PCT/JP2014/078878.

*Primary Examiner* — Alexander Oscar Williams
(74) *Attorney, Agent, or Firm* — Procopio, Cory, Hargreaves & Savitch LLP

(57) ABSTRACT

A sapphire structure with a metal substructure is disclosed. The sapphire structure with a metal substructure includes a sapphire structure and a metal substructure. The sapphire structure includes a flat surface and a concave portion on the flat surface. The metal substructure in the concave portion is bonded to an inner surface of the concave portion and includes a surface portion that is substantially flush with the flat surface.

19 Claims, 15 Drawing Sheets

(56) References Cited

U.S. PATENT DOCUMENTS

| | | | |
|---|---|---|---|
| 2004/0129948 A1* | 7/2004 | Uemura | 257/103 |
| 2005/0269577 A1* | 12/2005 | Ueda et al. | 257/80 |
| 2006/0223330 A1* | 10/2006 | Fudeta et al. | 438/752 |
| 2009/0093122 A1* | 4/2009 | Ueda et al. | 438/701 |
| 2010/0270651 A1* | 10/2010 | Li et al. | 257/618 |
| 2010/0320179 A1* | 12/2010 | Morita et al. | 219/121.69 |
| 2012/0212890 A1 | 8/2012 | Hoshino et al. | |
| 2012/0249281 A1 | 10/2012 | Campbell et al. | |
| 2013/0015487 A1* | 1/2013 | Okuno | 257/98 |
| 2013/0236699 A1 | 9/2013 | Prest et al. | |
| 2013/0328792 A1 | 12/2013 | Myers et al. | |
| 2014/0023430 A1 | 1/2014 | Prest et al. | |
| 2014/0030443 A1 | 1/2014 | Prest et al. | |

FOREIGN PATENT DOCUMENTS

| | | |
|---|---|---|
| JP | 2002-141543 A | 5/2002 |
| JP | 2002-201096 | 7/2002 |
| JP | 2002-257659 A | 9/2002 |
| JP | 2004-053290 A | 2/2004 |
| JP | 06-152103 A | 5/2004 |
| JP | 2011-061316 | 3/2011 |
| JP | 2011-259513 A | 12/2011 |
| JP | 2012-174053 A | 9/2012 |
| JP | 2013-193943 A | 9/2013 |

* cited by examiner

SAPPHIRE STRUCTURE WITH A CONCAVE PORTION INCLUDING A METAL SUBSTRUCTURE AND METHOD FOR PRODUCING THE SAME

CROSS-REFERENCE TO RELATED APPLICATION

The present application claims priority under 35 U.S.C. §119 to Japanese Patent Application No. 2013-225829, filed on Oct. 30, 2013, entitled "Sapphire Structure with Metal Substructure and Method for Producing the Same", the content of which is incorporated by reference herein in its entirety.

FIELD

The present invention relates to a sapphire structure with a metal substructure.

BACKGROUND

Sapphire has been widely used as a substrate for gallium nitride (GaN) crystal growth because sapphire as a single crystal of alumina has a crystal lattice whose structure is close to that of GaN. Further, various devices using the sapphire have been developed.

SUMMARY

A sapphire structure with a metal substructure and a method for producing a sapphire structure with a metal substructure are presented. The sapphire structure with a metal substructure includes a sapphire structure and a metal substructure. The sapphire structure includes a flat surface and a concave portion on the flat surface. The metal substructure is at least partially housed within the concave portion of the sapphire structure. The metal substructure housed within the concave portion of the sapphire structure is bonded to the inner surface of the concave portion. The metal substructure includes a surface portion that is substantially flush with the flat surface of the sapphire structure.

Further, a method for producing a sapphire structure with a metal substructure includes forming a concave portion on a flat surface of a sapphire structure; applying metal paste that contains metal particles and a solvent to the inside of the concave portion; forming a metal substructure in the concave portion, which is bonded to an inner surface of the concave portion, by heating the sapphire structure and the metal paste to evaporate the solvent contained in the metal paste and to bind the metal particles to each other; and making at least part of a surface of the metal substructure substantially flush with the flat surface of the sapphire structure by polishing the flat surface of the sapphire structure and a surface of the metal substructure at the same time.

DESCRIPTION

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure are described herein in the context of one practical non-limiting application, namely, an electronic apparatus such as a mobile phone. Embodiments of the disclosure, however, are not limited to such mobile phone, and the techniques described herein may be utilized in other applications. For example, embodiments may be applicable to e-readers, digital cameras, electronic game machines, digital music players, personal digital assistants (PDA), tablets, personal handy phone system (PHS), laptop computers, TV's, Global Positioning Systems (GPS's) or navigation systems, health equipment, and other communication devices.

As would be apparent to one of ordinary skill in the art after reading this description, these are merely examples and the embodiments of the disclosure are not limited to operating in accordance with these examples. Other embodiments may be utilized and structural changes may be made without departing from the scope of the exemplary embodiments of the present disclosure.

Figure 1A:
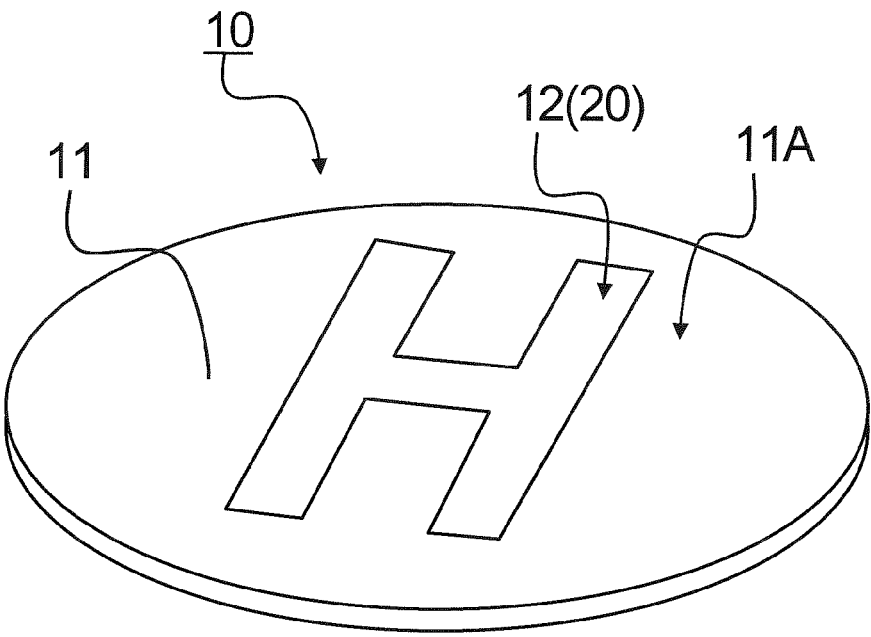
FIG. 1A is a schematic perspective view describing a sapphire structure with a metal substructure.
Figure 1B:
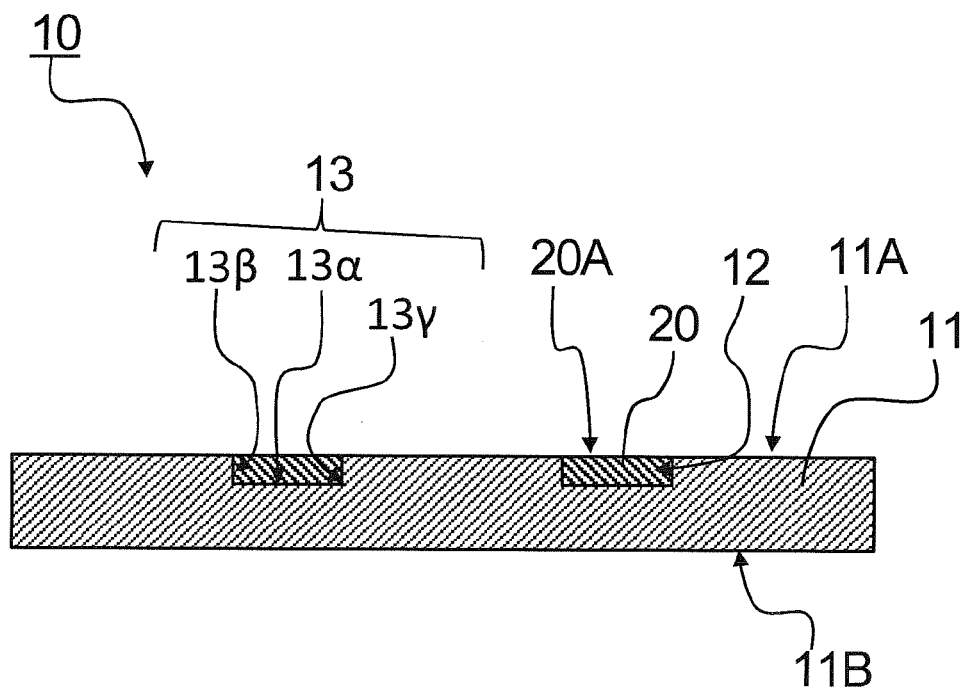
FIG. 1B is a schematic cross-sectional view of FIG. 1A.

FIGS. 1A and 1B are views describing a sapphire structure 10 with a metal substructure (hereinafter, also simply referred to as a structure 10 with a metal substructure). FIG. 1A is a schematic perspective view, and FIG. 1B is a schematic cross-sectional view.

The structure 10 with a metal substructure includes a sapphire structure 11, which includes a flat surface 11A and a concave portion 12 on the flat surface 11A. A metal substructure 20 is located within the concave portion 12 and is bonded to an inner surface 13 of the concave portion 12. The metal substructure 20 includes a surface portion 20A which is substantially flush with the flat surface 11A of sapphire structure 11. The sapphire structure 11 is a plate-like body and includes the flat surface 11A as a first surface and a second surface 11B on the opposite side of the flat surface 11A. The sapphire structure 11 includes sapphire which is a single crystal of aluminum oxide ($Al_2O_3$) and contains aluminum oxide ($Al_2O_3$) in the range of 75% by mass or more. It is preferable that the sapphire structure contain aluminum oxide ($Al_2O_3$) in the range of 95% or more. In addition, the flat surface 11A of the sapphire structure is substantially flush with the surface portion 20A of the metal substructure 20. Substantially flush means that the height difference between the flat surface 11A and the surface portion 20A of the metal substructure 20 is less than 500 μm. The height difference between the flat surface 11A and the surface portion 20A of the metal substructure 20 is preferably less than 100 μm. Further, the height difference thereof is more preferably less than 10 μm, still more preferably less than 1 μm, and still more preferably less than 0.1 μm.

The metal substructure 20 contains silver (Ag) as a main component. The meaning of "main component" is that the component is contained by the amount of at least 50% by mass and preferably 70% by mass.

Further, the metal substructure 20 may contain copper (Cu) or titanium (Ti). In addition, in the structure 10 with a metal substructure, the arithmetic average roughness (Ra) of the surface portion 20A of the metal substructure 20, which is substantially flush with the flat surface 11A, is greater than that of the flat surface 11A. In addition, the arithmetic average roughness of the flat surface 11A is preferably 10 nm or less. The arithmetic average roughness of the flat surface 11A is more preferably 1 nm or less. The arithmetic average roughness thereof may be a value measured by a measurement method in conformity with JIS standard B0601-2001. In the structure 10 with a metal substructure, since the metal substructure 20 is arranged in the concave portion 12 and bonded to the inner surface 13 of the concave portion 12, the metal substructure 20 is difficult to detach from the structure 10.

Figure 2:
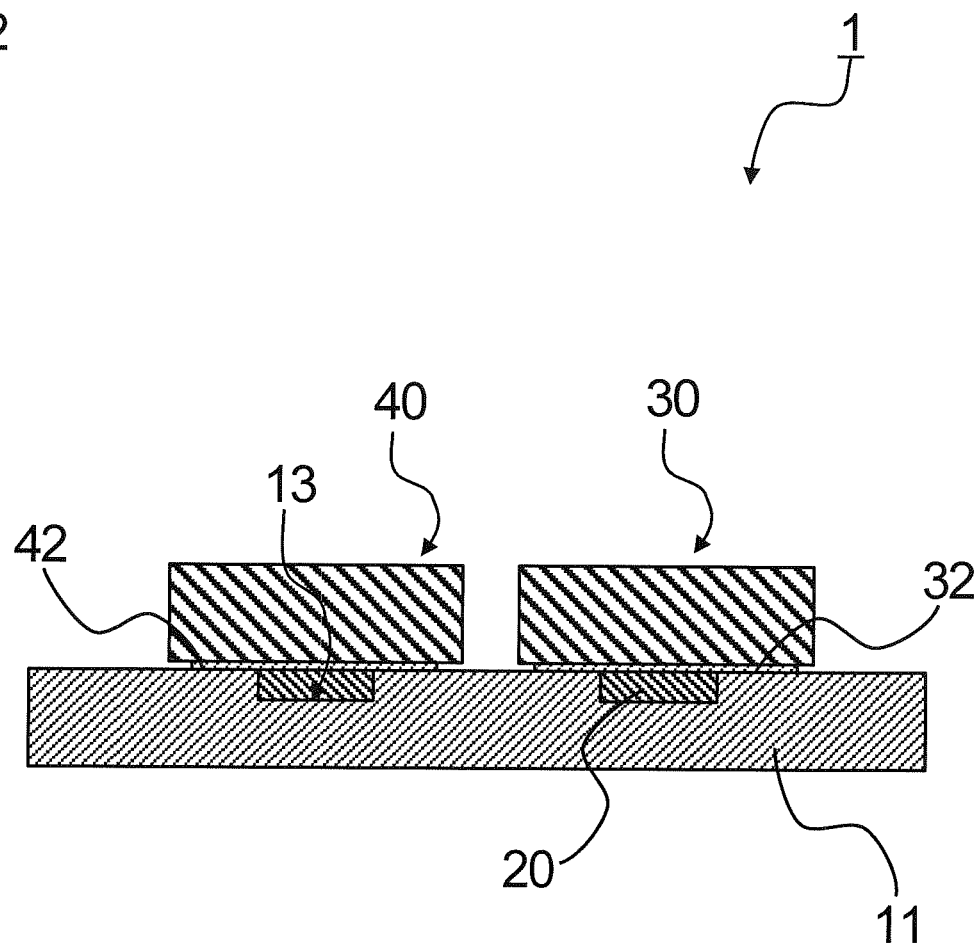
FIG. 2 is a cross-sectional view illustrating a device configured using the sapphire structure with a metal substructure that is illustrated in FIGS. 1A and 1B.

FIG. 2 is a cross-sectional view illustrating a device configured using the structure 10 with a metal substructure. In the device 1 as illustrated in FIG. 2, a first device 30 and a second device 40 are mounted on the structure 10 with a metal substructure. The first device 30 and the second device 40 are electrically connected by the metal substructure 20 which functions as an electrical wiring. The first device 30 illustrated in FIG. 2 is, for example, a driving circuit element including an electrode 32. The second device 40 is, for example, a light emitting diode (LED) including an electrode 42. Either the first device 30 or the second device 40 may be an exterior member. It is also possible for both first device 30 and second device 40 to be exterior members.

Since the metal substructure 20 includes the surface portion 20A, which is substantially flush with the flat surface 11A, the first device 30 or the second device 40 can be in contact with the structure 10 with a metal substructure with substantially no gaps between the first device 30 and the structure 10, or between the second device 40 and the structure 10. The first device 30 or the second device 40 is mounted on the structure 10 with a metal substructure as illustrated in FIG. 2.

The sapphire structure 11 has high thermal conductivity because of its sapphire content. Therefore, heat emitted from the first device 30 or the second device 40 can be efficiently dissipated from the sapphire structure 11 by bringing a portion of the first device 30 or the second device 40 into contact with the flat surface 11A of the sapphire structure 11, with at most only a small gap between the device 30 or device 40 and the sapphire structure 11. Operational reliability of the first device 30 or the second device 40 can be improved because heat is efficiently dissipated away from the devices.

The sapphire structure 11 is light-transmissive. Therefore, the light emitted from the second device 40, which is a light emitting diode (LED), enters the sapphire structure 11 on one side and can be radiated in a wide range on the opposite side of sapphire structure 11, as illustrated by FIG. 2. In the device 1, since the gap between the flat surface 11A of the sapphire structure 11 and the second device 40 is minimal to non-existent, there is no refractive index difference between the sapphire structure 11 and an air layer the way there would be if there was a substantial gap present. Thus, more light can be radiated through the sapphire structure 11 because by extra reflection light is suppressed.

Further, sapphire has small electrical resistance, and the dark current flowing over the surface of the sapphire structure 11 is suppressed so as to be small. Therefore, it is less likely that either first device 30 or second device 40 mounted on the surface of the sapphire structure 11 will experience operation failure caused by a dark current. The first device 30 or the second device 40 may be a transmitter or a receiver for transmitting or receiving electromagnetic signals in a wireless manner. Because sapphire has very low dielectric loss, electromagnetic waves can be transmitted or received with a small loss across a wide range of frequencies when a transmitter or a receiver is mounted on the sapphire structure 11. The types of devices that first device 30 or the second device 40 are not limited to the examples given above, and various devices or apparatuses can be mounted.

The structure 10 with a metal substructure may be used for other purposes aside from mounting devices on the structure 10 with a metal substructure as described above. The structure 10 with a metal substructure has a characteristic appearance such that the flat surface 11A of the sapphire structure 11, which has the property of high light transmission, is substantially flush with the surface portion 20A of the metal substructure 20, which has metallic glossiness. For example, when the structure 10 with a metal substructure is used for part of a housing which covers a device capable of transmitting and receiving a wireless signal, a transceiving device may be formed. Because sapphire has very low dielectric loss, this transceiving device has high transmitting and receiving sensitivity of the wireless signal. Furthermore, the housing in the transceiving device has high strength and is difficult to be broken. Finally, the transceiving device has a characteristic appearance, which may be considered a striking and unique design. Thus the structure 10 with a metal substructure can be used for different purposes.

In the structure 10 with a metal substructure, the arithmetic average roughness (Ra) of the surface portion 20A may be greater than the arithmetic average roughness (Ra) of the flat surface 11A. Accordingly, the bonding strength between the surface portion 20A and either a solder layer or a metallized layer is increased by an anchor effect due to unevenness of the surface portion 20A when the first device 30 or the second device 40 is bonded to the surface portion 20A of the metal substructure 20 via the solder layer or the metallized layer. The metal substructure 20 is difficult to detach from the concave portion 12 as described above. This in turn makes it difficult to detach the first device 30 or the second device 40, which are attached to a metal substructure 20, from the sapphire structure 11.

Figure 3:
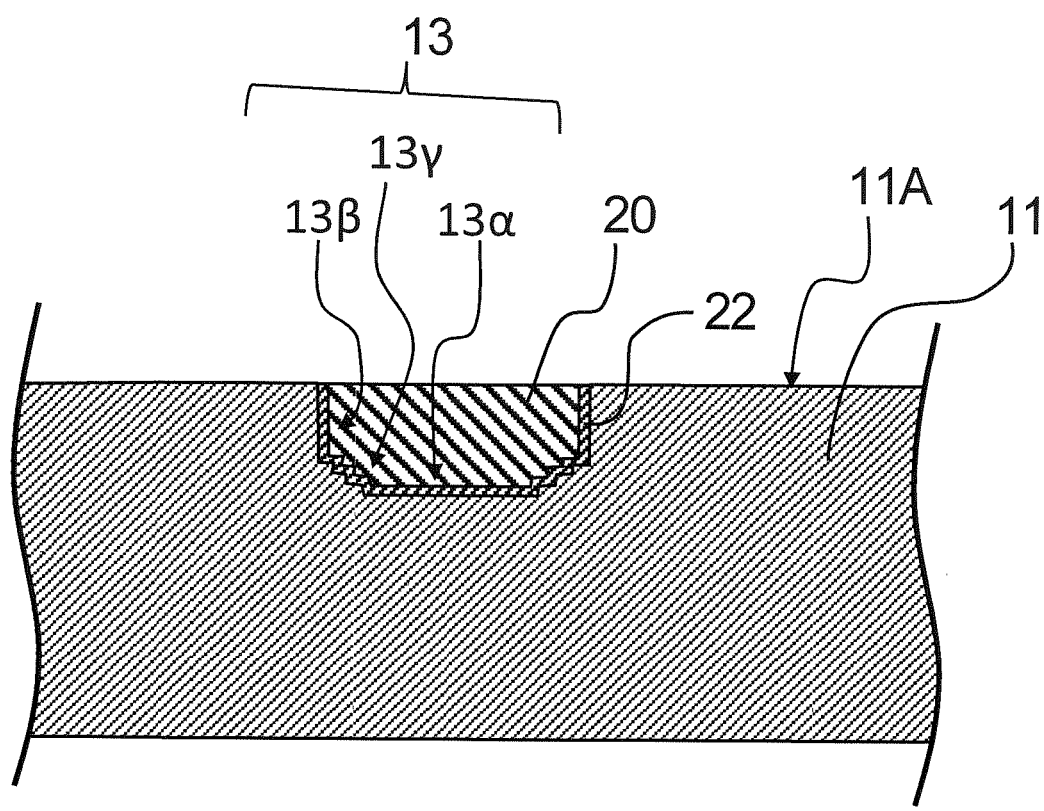
FIG. 3 is a partially enlarged view of FIG. 1B.

FIG. 3 is a partially enlarged view of FIG. 1B. The metal substructure 20 may contain silver (Ag) as a main component. In addition, the metal substructure 20 may also contain copper (Cu) and titanium (Ti). When the structure 10 is used as a wiring board or the like, silver (Ag) is preferable in terms of low electrical resistance and high conductivity. The hardness of the metal substructure 20 containing silver (Ag) and copper (Cu) may be higher than that of the metal substructure containing only silver (Ag). The bonding strength between the metal substructure 20 and the inner surface 13 of the concave portion 12 becomes relatively high when the metal substructure 20 contains titanium (Ti). Specifically, as illustrated in FIG. 3, a bonding layer 22 containing titanium (Ti) as a main component is formed in a bonding area in which the metal substructure 20 is bonded to the inner surface 13, and the metal substructure 20 and the inner surface 13 are relatively strongly bonded to each other.

As illustrated in FIG. 3, the inner surface 13 of the concave portion 12 includes a bottom surface 13α, a side surface 13β, and a corner 13γ. The bottom surface 13α is substantially parallel to the flat surface 11A, and the side surface 13β is substantially vertical to the bottom surface 13α and the flat surface 11A. The corner 13γ is inclined with respect to the bottom surface 13α and the side surface 13β. The corner 13γ has an arithmetic surface roughness greater than those of the bottom surface 13α and the side surface 13β. The arithmetic surface roughness of the corner 13γ is large enough that the unevenness of the surface of the corner 13γ is relatively large when compared to the bottom surface 13α and the side surface 13β. Thus, the metal substructure 20 is rigidly bonded to the corner 13γ due to the anchor effect, and the metal substructure 20 is difficult to detach from the concave portion 12.

Figure 4:
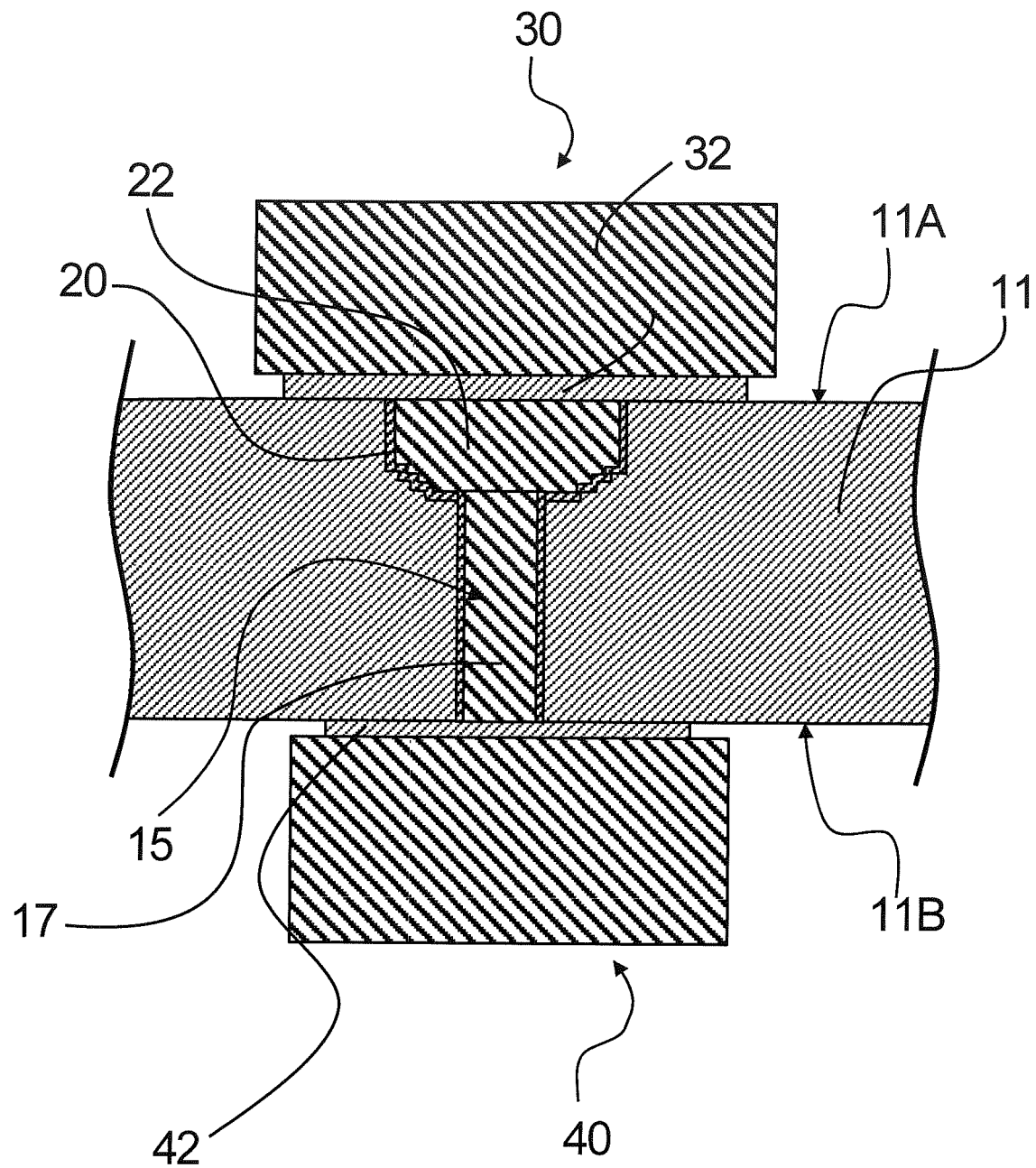
FIG. 4 is a cross-sectional view corresponding to FIG. 3 illustrating a sapphire structure with a metal substructure wherein that includes a through-hole.

FIG. 4 is a cross-sectional view of another embodiment of the sapphire structure with a metal substructure. In the embodiment illustrated in FIG. 4, the sapphire structure 11 includes a through-hole 15, which has openings on the bottom surface 13α of the concave portion 12 and the second surface 11B. Further, the sapphire structure 11 includes a via conductor 17 which fills in the through-hole 15. The via conductor 17 includes a metal.

In the embodiment illustrated in FIG. 4, a first device 30 including an electrode 32 is arranged on the flat surface 11A. The first device 30 may be a driving circuit element. A second device 40 including an electrode 42 is arranged on the second surface 11B. The second device 40 may be a light emitting element. The first device 30 and the second device 40 can be conducted through the via conductor 17 and the metal substructure 20.

Figure 5:
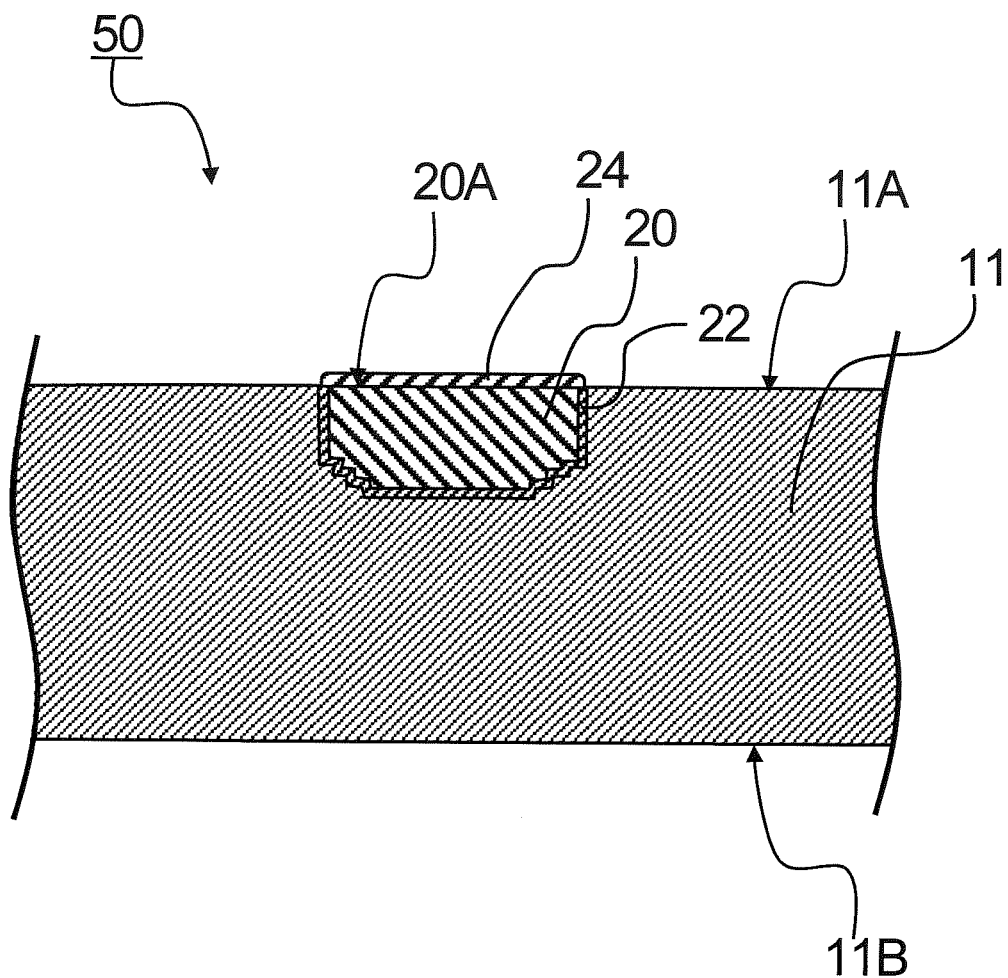
FIG. 5 is a cross-sectional view illustrating a member with a metal pattern using the sapphire structure with a metal substructure.

FIG. 5 is a cross-sectional view illustrating another embodiment, in which a member with a metal pattern is attached to the sapphire structure with a metal substructure. A member 50 with a metal pattern, as illustrated in FIG. 5, includes a metal layer 24 such as a gold (Au)-plated layer on the surface portion 20A of the metal substructure 20. In this manner, the metal layer 24 made of a metal different from the metal substructure 20 is formed on the surface portion 20A of the metal substructure 20. Thus, the external appearance or the electrical characteristics of the structure 10 with a metal substructure can be adjusted.

FIGS. 6A to 6E are cross-sectional views illustrating a method for producing the sapphire structure with a metal substructure. This method includes a process of forming the concave portion 12 (see FIG. 6B) on the flat surface 11A by performing processing on part of the flat surface 11A of the sapphire structure 11 (see FIG. 6A) including the flat surface 11A; a process of applying metal paste 19 (see FIG. 6C) which contains metal particles 17 and a solvent 18 into the concave portion 12; a process of forming the metal substructure 20 (see FIG. 6D) which is arranged in the concave portion 12 and bonded to the inner surface 13 of the concave portion 12 by heating the sapphire structure 11 and the metal paste 19 to evaporate the solvent 18 and bind the metal particles 21 to each other; and a process of making at least part of the surface portion 20A substantially flush with the flat surface 11A (see FIG. 6E) by polishing the flat surface 11A and the surface portion 20A at the same time.

Figure 6A:
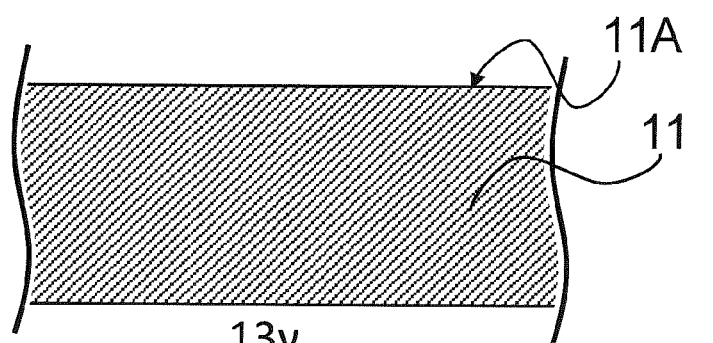
FIGS. 6A through 6E are cross-sectional views illustrating a method for producing the sapphire structure with a metal substructure.

Hereinafter, respective processes will be described in detail. First, as illustrated in FIG. 6A, the sapphire structure 11 having the flat surface 11A is prepared. The sapphire structure may be a circular sapphire substrate having a thickness of 600 μm is prepared.

Figure 6B:
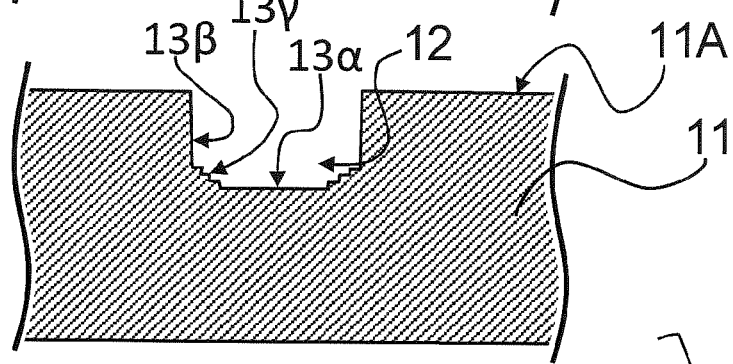

Next, as illustrated in FIG. 6B, the concave portion 12 is formed on the flat surface 11A by milling a part of the flat surface 11A of the sapphire structure 11 using a so-called machining center device. Specifically, grinding processing is performed on a portion corresponding to the concave portion 12 of the sapphire structure 11 by rotating and moving a so-called diamond electrodeposition tool to which diamond abrasive grains are adhered. The depth of the concave portion 12 is set to, for example, approximately 120 μm. Sapphire has high hardness, which makes it difficult to process. Thus, the surface after milling is unlikely to be flat. Particularly, because it is difficult to ensure stable contact of the diamond electrodeposition tool on the corner 13γ when compared to the bottom surface 13α and the side surface 13β, the arithmetic surface roughness of the corner 13γ becomes greater than the arithmetic surface roughness of both the bottom surface 13α and the side surface 13β. After milling is complete, the temperature of the entire sapphire structure 11 is increased to a higher temperature, for example 1650° C. An annealing process, which maintains the temperature range of 1500° C. to 1800° C., is then performed for approximately 3 hours. The annealing process reduces the internal stress remaining on the inner surface 13 of the concave portion 12 after milling.

Figure 6C:
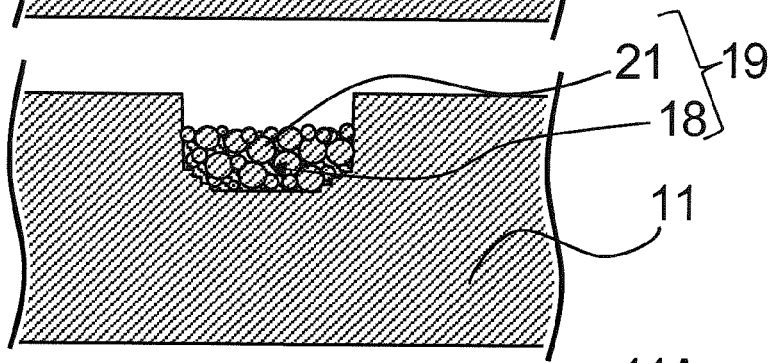

Next, as illustrated in FIG. 6C, the metal paste 19 containing metal particles 17 and the solvent 18 is applied to the concave portion 12 using a brush or the like. For example, the metal paste 19 is applied to the concave portion 12 such that the metal paste 19 forms a layer in the concave portion 12 with a thickness in the range of 60 μm to 120 μm. The metal particles 21 contain silver (Ag) as a main component, and the metal paste 19 further contains silicon dioxide ($SiO_2$) together with a solvent. In addition, the metal paste 19 also contains copper (Cu) particles and titanium (Ti) particles. For example, the metal paste 19 may contain approximately 65% by mass of silver (Ag) particles, approximately 28% by mass of copper (Cu) particles, and the remaining percentage by mass composed of a mixture of titanium (Ti) particles, silicon dioxide ($SiO_2$) particles, and the solvent 18.

Figure 6D:
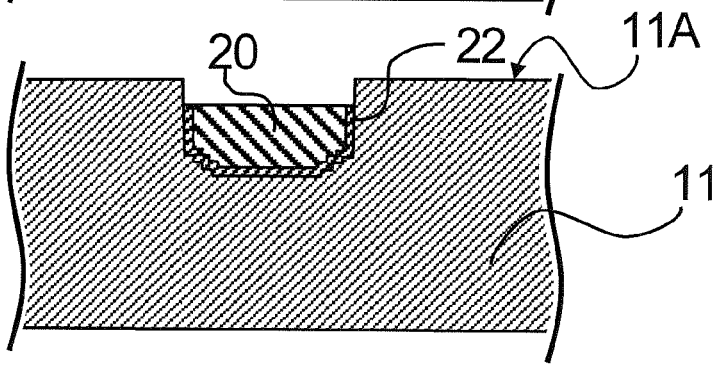

Next, as illustrated in FIG. 6D, the sapphire structure 11 to which the metal paste 19 is applied is heated to a temperature of 600° C. to 900° C. The solvent 18 contained in the metal paste 19 is evaporated, and the metal particles 21 are bound to each other within the concave portion 12. Thus, the metal substructure 20 is formed, and the metal substructure 20 is bonded to the inner surface 13 of the concave portion 12.

Because the metal paste 19 includes copper (Cu), a compound of silver (Ag) and copper (Cu) is formed by firing. Thus, the hardness of the metal substructure 20 is higher than it would be if the metal paste 19 contained only silver (Ag). Further, since the metal substructure 20 contains titanium (Ti), the bonding layer 22 containing titanium (Ti) as a main component is formed in a bonding area in which the inner surface 13 is bonded to the metal substructure 20 by firing. Thus, the metal substructure 20 and the inner surface 13 are more strongly bonded to each other. Further, since the metal paste 19 contains silicon dioxide ($SiO_2$), the silicon dioxide ($SiO_2$) ingredients are diffused to the sapphire structure 11 by firing, and the bonding strength between the metal substructure 20 and the sapphire structure 11 is increased. After firing, the entire body is washed using an organic solvent, pure water, or the like as needed.

Figure 6E:
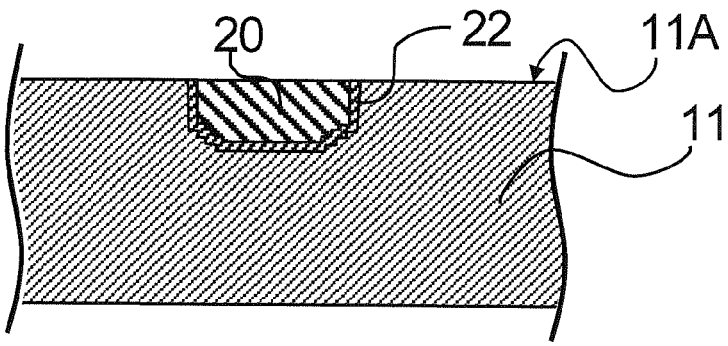

As illustrated by FIG. 6E, subsequently at least part of the surface 20A of the metal substructure 20 is made substantially flush with the flat surface 11A by polishing the flat surface 11A and the surface portion 20A of the metal substructure 20. The polishing process includes a first step of polishing only the flat surface 11A and a second step of polishing both the flat surface 11A and the metal substructure 20 at the same time. In the first step, the flat surface 11A is polished but the metal substructure 20 is not polished. In the second step, the flat surface 11A and the metal substructure 20 are polished at the same time.

In the first step, mechanical polishing is performed using a copper plate as a polishing pad and diamond abrasive grains having a grain size of approximately 1 μm to 3 μm as abrasive grains for polishing. In the first step, only a portion of the flat surface 11A which protrudes further than the surface portion 20A of the metal substructure 20 is selectively polished so that the flat surface 11A after polishing becomes substantially flush with the surface portion 20A of the metal substructure 20.

After the first step, chemical mechanical polishing (so-called CMP) is performed using colloidal silica abrasive grains having a grain size of approximately 20 μm to 80 μm as abrasive grains for polishing. In the chemical mechanical polishing, both the flat surface 11A of the sapphire structure 11 and the surface portion 20A of the metal substructure 20 are polished at the same time.

The flat surface 11A of the sapphire structure 11 made of a single crystal of alumina is flattened with high precision by the chemical mechanical polishing. For example, the arithmetic average roughness of the flat surface 11A of the sapphire structure 11 can be made to be 10 nm or less by the chemical mechanical polishing and, it is possible for the arithmetic average roughness of the flat surface 11A can be made to be 1 nm or less.

The metal substructure 20 is a layer obtained by metal particles 17 in the metal paste 19 described above being bound to each other, and as polishing advances, the metal particles 21 are partially peeled off by the chemical mechanical polishing. Therefore, even after the chemical mechanical polishing there is unevenness present in the surface portion 20A of the metal substructure 20 due to the shape of the metal particles 21, and the arithmetic average roughness (Ra) of the surface portion 20A, which is substantially flush with the flat surface 11A, is greater than the arithmetic average roughness (Ra) of the flat surface 11A.

The structure 10 with a metal substructure may be produced by performing the above-described processes. In addition, the above-described processes may be used to form the through-hole 15 and the via conductor 17. First the through-hole 15 is formed. Then the through-hole 15 is filled with the metal paste 19 using the same methods described above to apply the metal paste 19 to the concave portion 12 in order to form the via conductor 17. The production method of the present invention is not particularly limited in regard to other conditions or the like.

<Electronic Apparatus>

Figure 7:
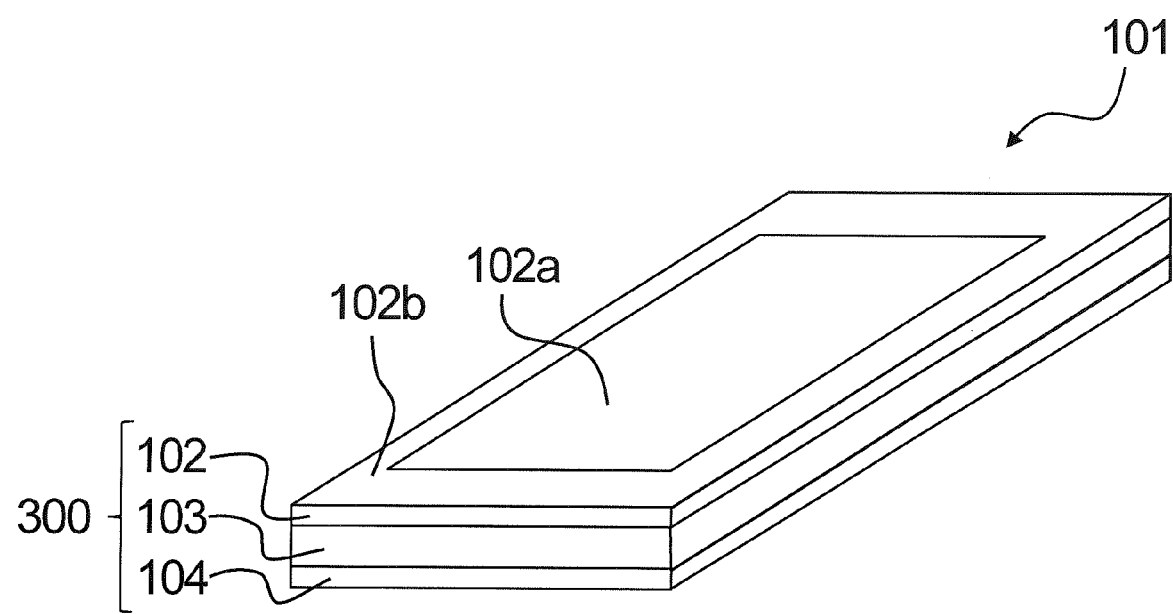
FIG. 7 is a perspective view illustrating an electronic apparatus configured using the sapphire structure with a metal substructure.
Figure 8:
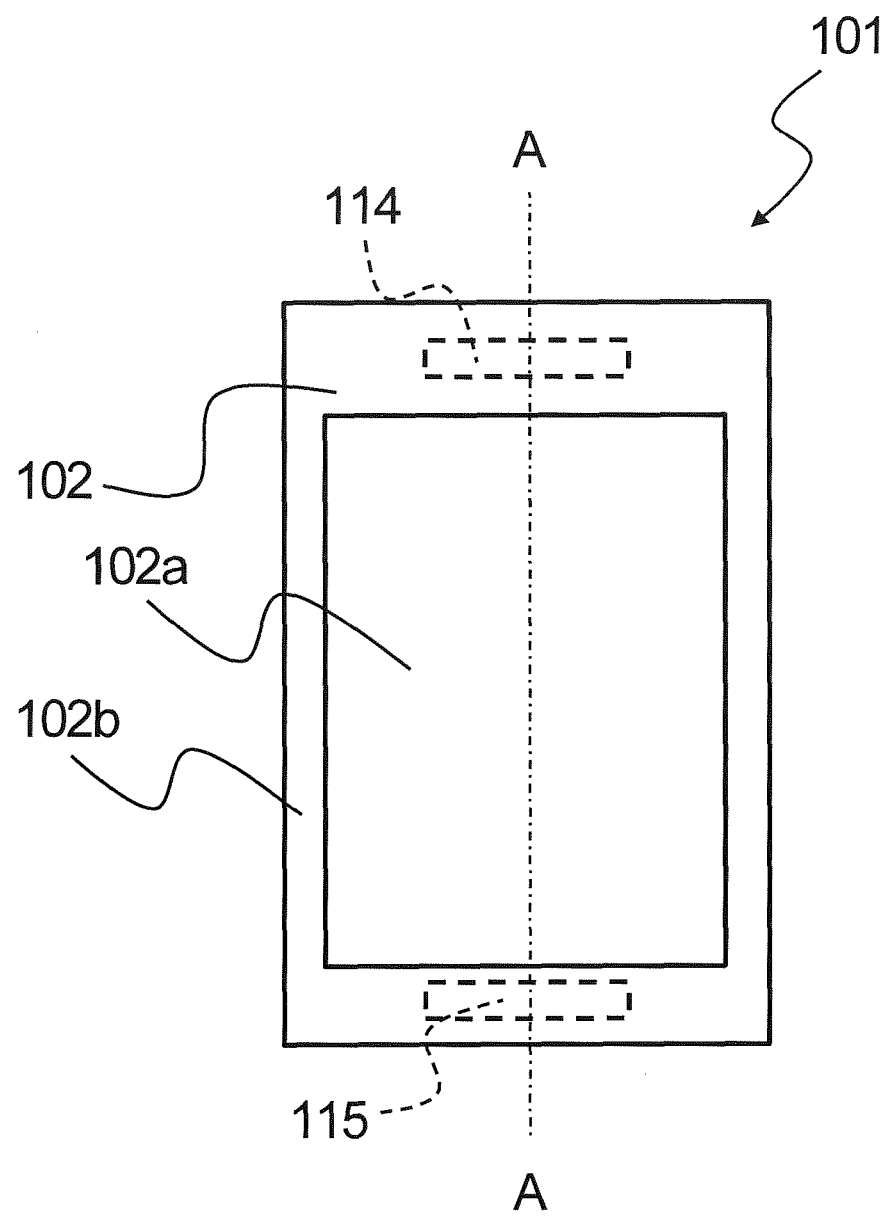
FIG. 8 is a front view illustrating the electronic apparatus configured using a sapphire structure with a metal substructure.
Figure 9:
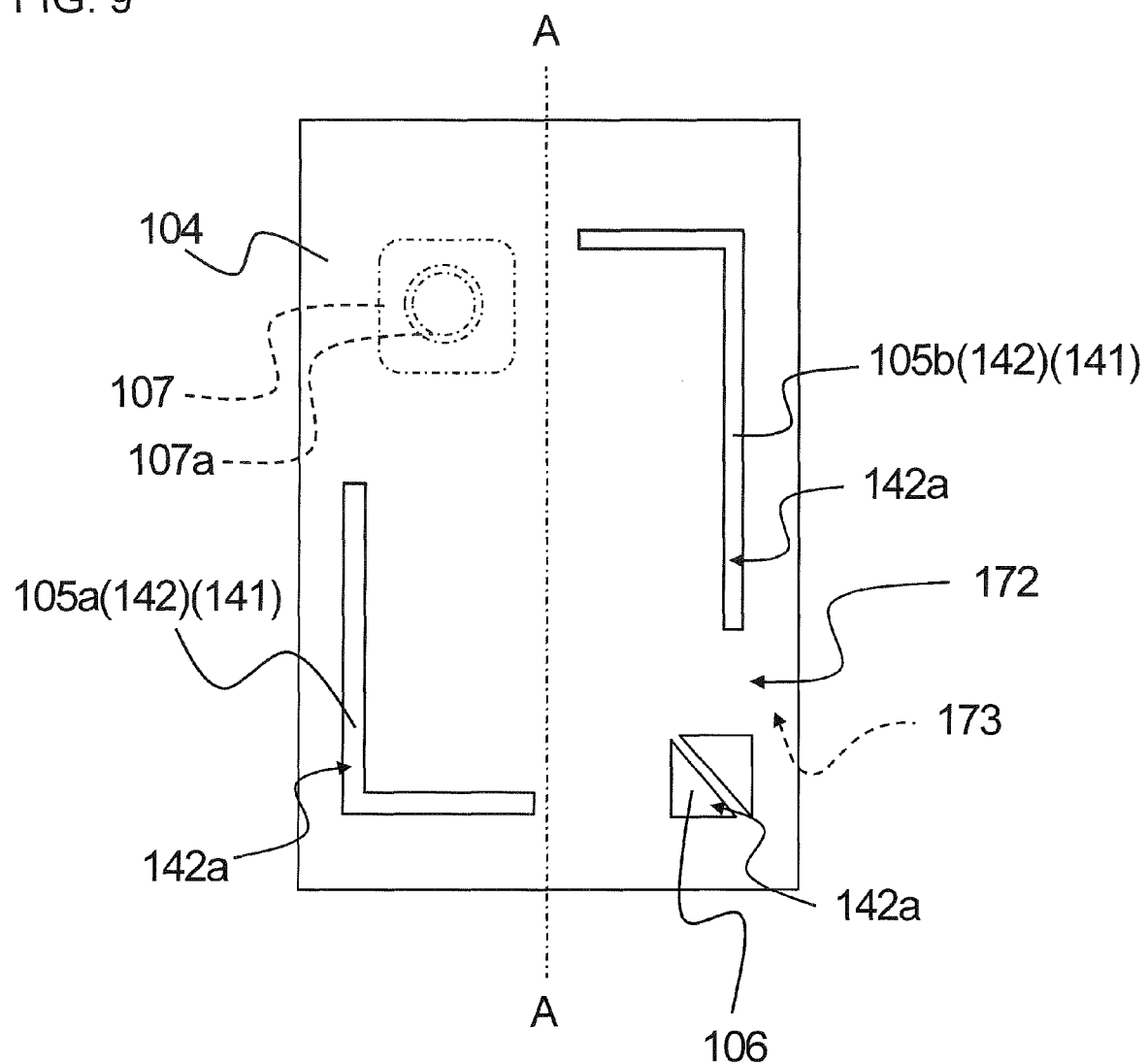
FIG. 9 is a rear view illustrating the electronic apparatus configured using a sapphire structure with a metal substructure.
Figure 10:
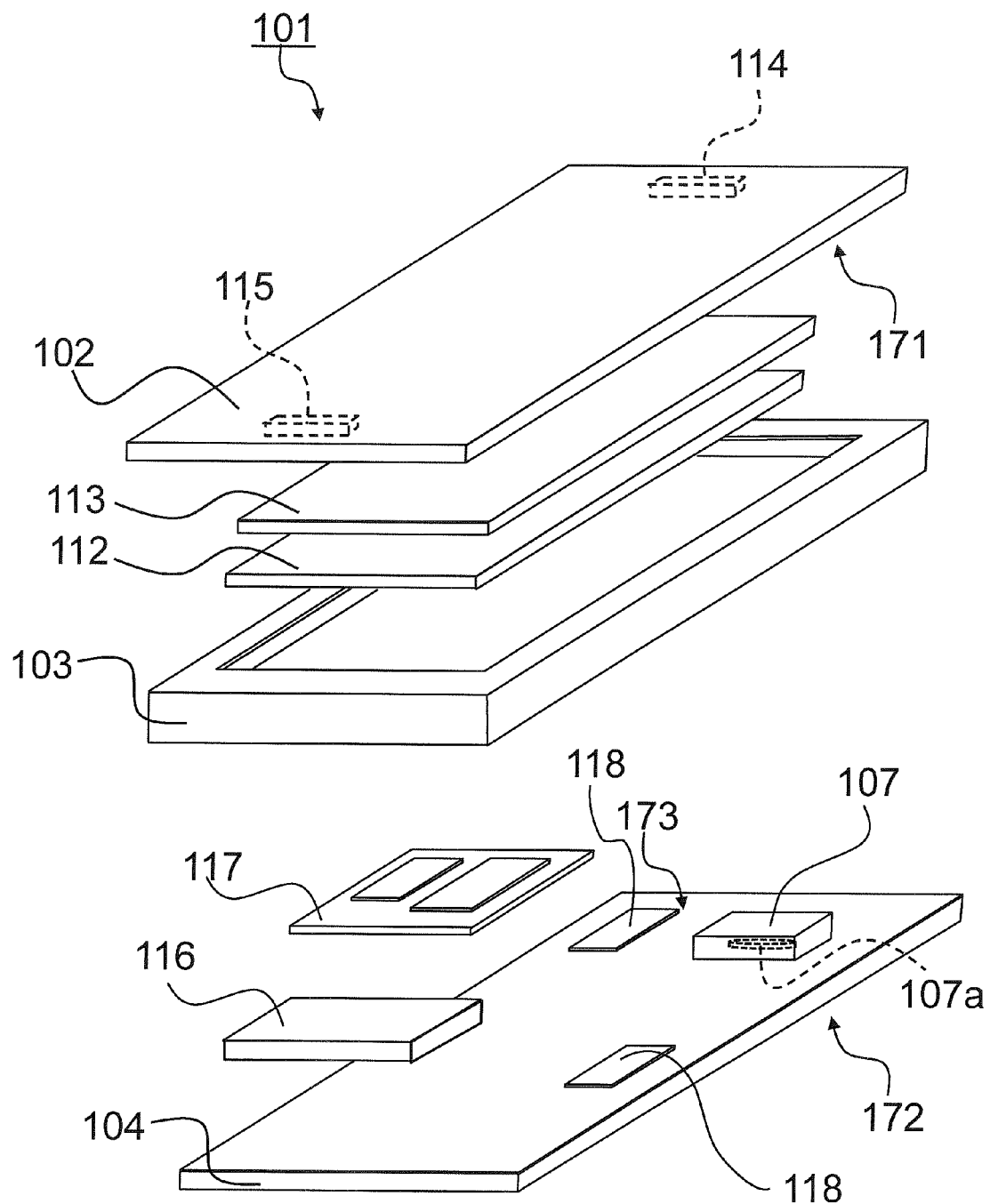
FIG. 10 is an exploded perspective view illustrating the electronic apparatus configured using a sapphire structure with a metal substructure.

FIGS. 7 to 10 are views illustrating the external appearance of the electronic apparatus configured using an embodiment of the sapphire structure with a metal substructure described above, and FIG. 7 is a perspective view, FIG. 8 is a front view, FIG. 9 is a rear view, and FIG. 10 is an exploded perspective view. An electronic apparatus 101 as illustrated by FIGS. 7 through 10 is a mobile phone such as a smart phone, and the electronic apparatus 10 can communicate with another communication device via a base station, a server, and the like. The shape of the electronic apparatus 101 is a rectangular plate-like shape in a plan view or top view. An exterior body 300 of the electronic apparatus 101 is configured of a first surface panel 102, a housing 103, and a rear surface side panel 104.

The first surface panel 102 contains a transparent hard material. The first surface panel 102 contains sapphire as a main component. Sapphire has the characteristics of being difficult to damage or break, having high transparency, and having high thermal conductivity when compared to strengthened glass or the like.

As illustrated by FIG. 7, the first surface panel 102 includes a display area 102a and a peripheral edge area 102b. Various pieces of information such as characters, symbols, figures, and moving images displayed by a display device 112 described below are visually recognized by a user through the display area 102a in the first surface panel 102.

A touch panel 113 described below is attached to an inner surface 171 of the first surface panel 102. The user can issue various instructions with respect to the electronic apparatus 101 by operating the display area 102a of the first surface panel 102 using a finger or the like. Further, as illustrated in FIG. 8, a piezoelectric vibrating element 114 and a microphone 115 are attached to the inner surface 171 of the first surface panel 102.

The housing 103 constitutes part of the side surface portion of the electronic apparatus 101. The housing 103 contains sapphire as a main component similarly to the first surface panel 102.

Figure 11A:
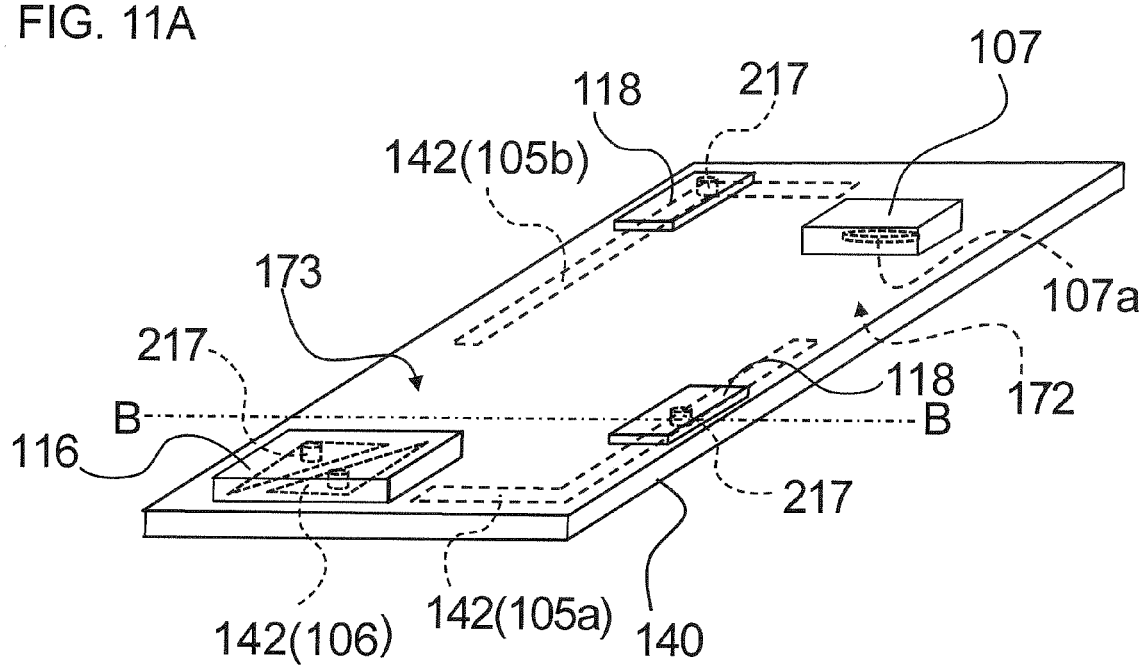
FIG. 11A is a perspective view illustrating an embodiment of rear surface side panel.

As illustrated by FIG. 11A, the rear surface panel 104 is a sapphire structure with a metal substructure as described above. The rear surface panel 104 includes a first surface 172, a sapphire structure 140 in which a concave portion 141 is on the first surface 172, and a metal substructure 142 arranged in the concave portion 141 and bonded to an inner surface 143 of the concave portion 141.

Figure 11B:
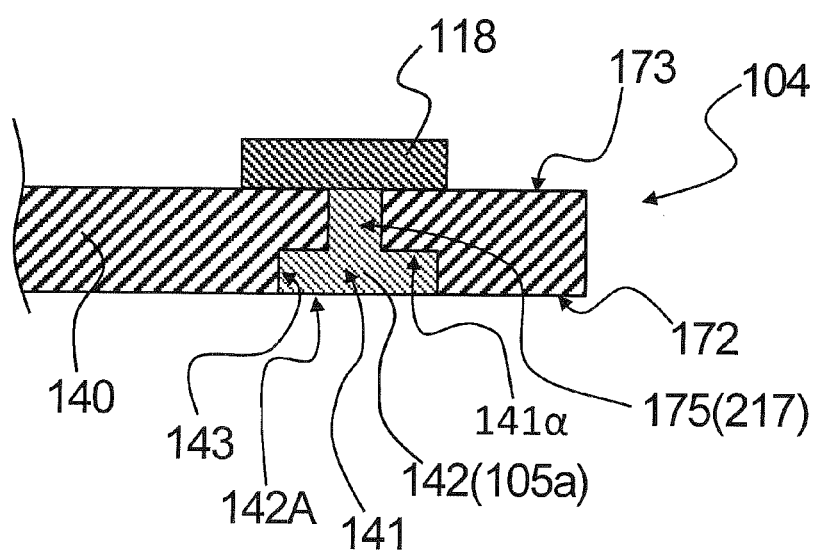
FIG. 11B is a cross-sectional view of FIG. 11A.

As illustrated by FIG. 11B, the metal substructure 142 includes a surface portion 142A which is substantially flush with the flat surface. The rear surface side panel 104 is plate-like and has a rectangular shape in a plan view or top view. The rear surface panel 104 constitutes the rear surface portion of the electronic apparatus 101. As shown by FIG. 11A, the rear surface panel 104 includes a first surface 172 constituting the rear surface of the electronic apparatus 101 and a second surface 173 positioned on the opposite side to the first surface 172. In the present embodiment, the metal substructure 142 contains antenna 105 (or alternatively, antennas 105*a* and 105*b*) and the terminal 106 for charging.

FIG. 10 is an exploded perspective view of the electronic apparatus 101. The first surface panel 102 and the housing 103 are bonded to each other.

In addition, in the same manner as bonding of the first surface panel 102 and the housing 103, the housing 103 and the rear surface panel 104 are bonded to each other.

The exterior body 300 includes three members which are the first surface panel 102, the housing 103, and the rear surface side panel 104. The exterior body 300 may include one, two, four or more members.

The touch panel 113, the piezoelectric vibrating element 114, and the microphone 115 are attached to the inner surface 171 of the first surface panel 102 using a double-sided tape or the like. The display device 112 is arranged so as to face the first surface panel 102 and the touch panel 113 (more specifically, the first surface panel 102 to which the touch panel 113 is attached).

A printed board 117 and a battery 116 are arranged on the rear surface of the display device 112. Various components such as a CPU 201 and a DSP 202 are installed on a printed board 117. The printed board 117 is electrically connected to other components included in the electronic apparatus 101 by a cable. In addition, the rear surface panel 104 is arranged so as to face the printed board 117 and the battery 116. The battery 116 is connected with a terminal 106 for charging by a conductor embedded in the rear surface side panel 104.

In this manner, the exterior body 300 accommodates electronic devices such as the CPU 201 and the DSP 202. The devices in the exterior body 300 generate heat during operation in some cases. However, sapphire contained in the exterior body 300 has high heat dissipation when compared to an exterior body that is at least partially made of resin. For this reason, heat emitted from the device during the operation of the device can be efficiently dissipated to the outside of the electronic apparatus 101 through the exterior body 300. As a result, in the electronic apparatus 101, it is possible to suppress any rise in temperature of the devices contained in the exterior body 300 and also suppress the rise in temperature in the exterior body 300. Accordingly, the likelihood that the electronic apparatus 101 will experience an operation failure due to high temperature can be reduced. FIG. 11A is a perspective view when the rear surface panel 104 is seen from the inside of the housing 103, and FIG. 11B is a cross-sectional view taken along a plane containing a B-B line.

As illustrated by FIG. 9, the metal substructure 142, which includes a surface that is flush with the first surface 172, is arranged on the rear surface of the electronic apparatus 101. The metal substructure 142 contains antenna 105 (or alternatively, antennas 105*a* and 105*b*) and the terminal 106 for charging. An imaging unit 107 is arranged on the second surface 173 of the rear surface side panel 104. The imaging unit 107 includes a lens 107*a* facing the second surface 173. Because sapphire has the property of high light transmission and because the rear surface panel 104 is a sapphire structure, the imaging unit 107 in the exterior body 300 is capable of performing photography. A communication circuit component 118 is arranged on the second surface 173.

As illustrated in FIGS. 11A and 11B, the rear surface side panel 104 includes a through-hole 175 including openings on a bottom surface 141α of the concave portion 141 and the second surface 173. Further, the rear surface panel 104 includes a via conductor 217 which fills in the through-hole 175 and includes a metal. In the embodiment illustrated in FIGS. 11A and 11B, the antenna 105*a* is exposed to the surface of the electronic apparatus 101, and the metal substructure 142 constituting the antenna 105*a* is electrically connected to a communication circuit component 118 or the like arranged on the second surface 173 side through the via conductor 217. The terminal 106 is exposed to the surface of the electronic apparatus 101, and the metal substructure 142 constituting the terminal 106 is electrically connected to a power terminal or the like (not illustrated) arranged on the second surface 173 side through the via conductor 217.

In the electronic apparatus 101, since the rear surface panel 104 contains sapphire as a main component, the rear surface panel 104 has high thermal conductivity. Thus, heat emitted by various devices or electronic circuits arranged in the exterior body 300 can be efficiently dissipated from the inside of the exterior body 300. Since sapphire has low electrical resistance, current leakage from the antenna 105 or the terminal 106 arranged in the rear surface side panel 104 is small. Thus, electronic apparatus 101 is less likely to malfunction. The rear surface panel 104 includes the first surface 172 and has a light transmission property. The metal substructure 142 has a metallic glossiness. The first surface 172 is substantially flush with the surface of the metal substructure so that the appearance of the electronic apparatus 101 is unique and different from that of a conventional apparatus.

The electronic apparatus 101 has high transmitting and receiving sensitivity of the wireless signal because of the antenna 105, is less likely to have malfunctions caused by the dark current, is difficult to be broken because of high strength of the exterior body 300, and has a unique appearance that lends itself to design.

Figure 12A:
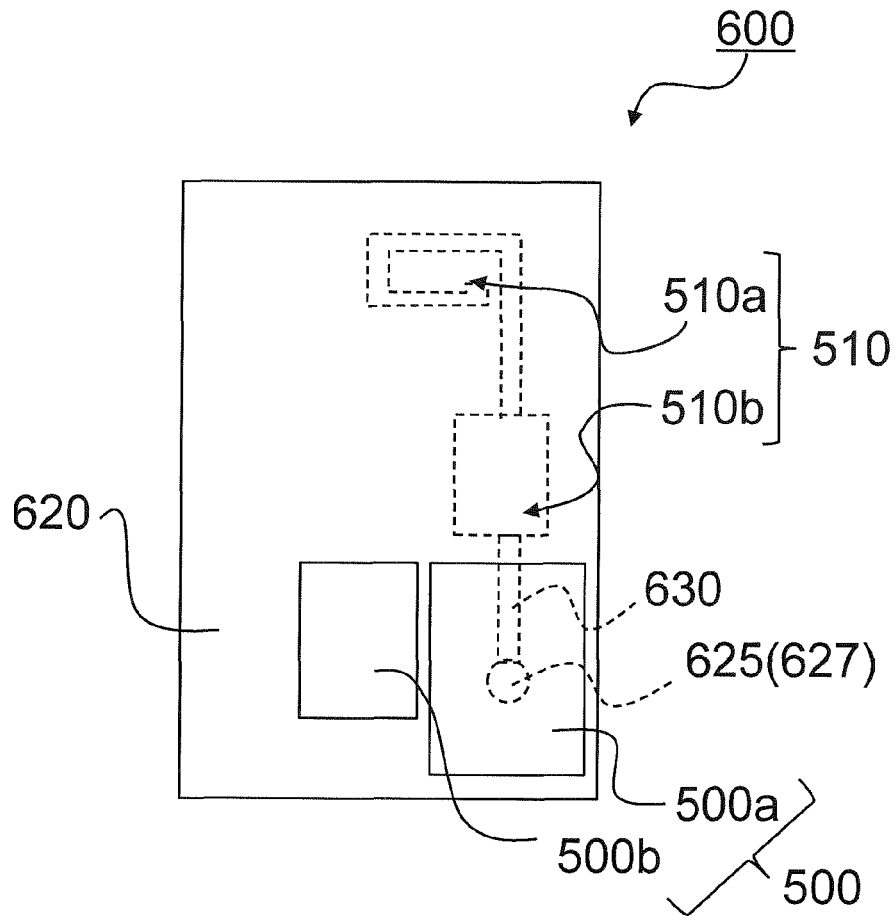
FIGS. 12A is a plan view illustrating a sapphire structure with a metal substructure.
Figure 12B:
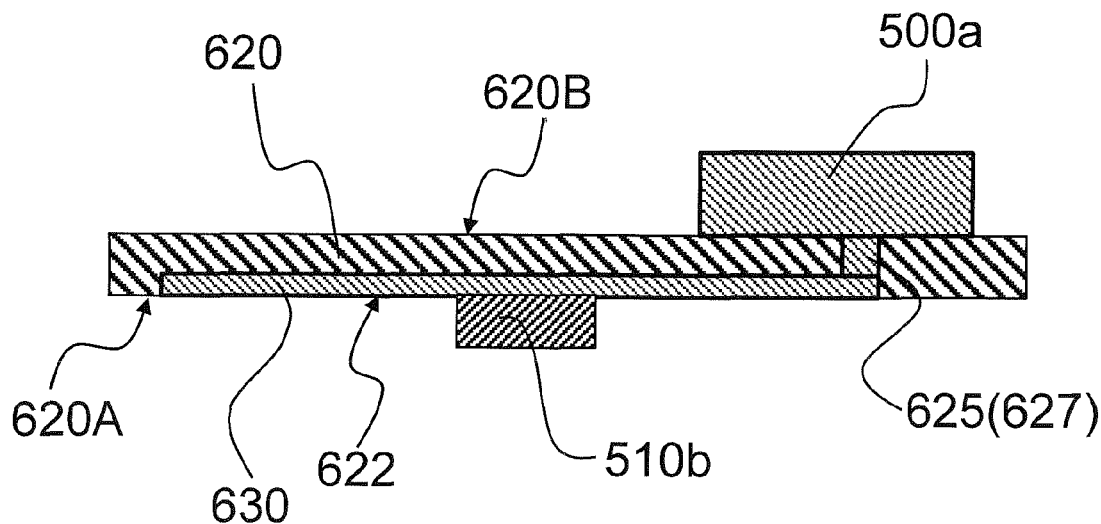
FIG. 12B is a cross-sectional view of FIG. 12A.

FIGS. 12A and 12B illustrate another embodiment in which the sapphire structure with a metal substructure described above is used for the electronic apparatus. FIGS. 12A and 12B are schematic views describing a mounting body 600. FIG. 12A is a plan view or top view and FIG. 12B is a cross-sectional view. The mounting body 600 includes a mount board 620 including a first surface 620A and a concave portion 622 on the first surface 620A. A metal substructure 630 is arranged in the concave portion 622 and is bonded to the inner surface of the concave portion 622. The metal substructure 630 includes a surface which is substantially flush with the first surface 620A.

The metal substructure 630 contains silver (Ag) as a main component. In addition, the metal substructure 20 contains copper (Cu) and titanium (Ti). Further, the mount board 620 includes a through-hole 625 and a via conductor 627. The through-hole 625 has openings on the bottom surface of the concave portion 622 and on a second surface 620B. The via conductor 627 fills in the through-hole 625 and includes a metal.

In the mounting body 600, a wireless communication unit 510 and the control unit 500 are arranged on the mount board 620. The control unit 500 includes the CPU 500*a*, the storage unit 500*b*, and the like. In the control unit 500, the CPU 500*a* and the storage unit 500*b* are mounted on the second surface 620B. In addition, the wireless communication unit 510 on the first surface 620A includes an antenna 510*a* and a wireless information processing unit 510*b*. The antenna 510 includes the metal substructure 630, and the wireless information processing unit 510*b* is mounted on the mount board 620. The wireless information processing unit 510*b*, the CPU 500*a*, and the storage unit 500*b* are devices including semiconductor elements. In the mounting body 600, the metal substructure 630 constitutes the antenna 510*b*. The CPU 500*a*, the storage unit 500*b*, and the wireless information processing unit 510b are connected to one another using the metal substructure 630 or the via conductor 627 as electrical wiring.

The mount board 620 has high thermal conductivity because the mount board 620 is made of sapphire. Thus when heat is emitted from the wireless communication unit 510 or the control unit 500, this heat can be efficiently dissipated through the mount board 620. Since sapphire has low electrical resistance, a dark current flowing over the surface of the mount board 620 is suppressed and so therefore is small. Thus, the CPU 500a, the storage unit 500b, and the wireless information processing unit 510b is less likely to malfunction due to heat emissions or dark currents.

The wireless information processing unit 510b, the CPU 500a, and the storage unit 500b are not limited to device components including semiconductor elements. They may be integrally formed on the mount board 620 by performing processing on a compound semiconductor layer which is formed on the mount board 620 made of sapphire. The mounting body 600 illustrated in FIG. 12A may be arranged in the inside of the exterior body 300 of the electronic apparatus 101, for example.

<Electrical Configuration of Electronic Apparatus>

Figure 13:
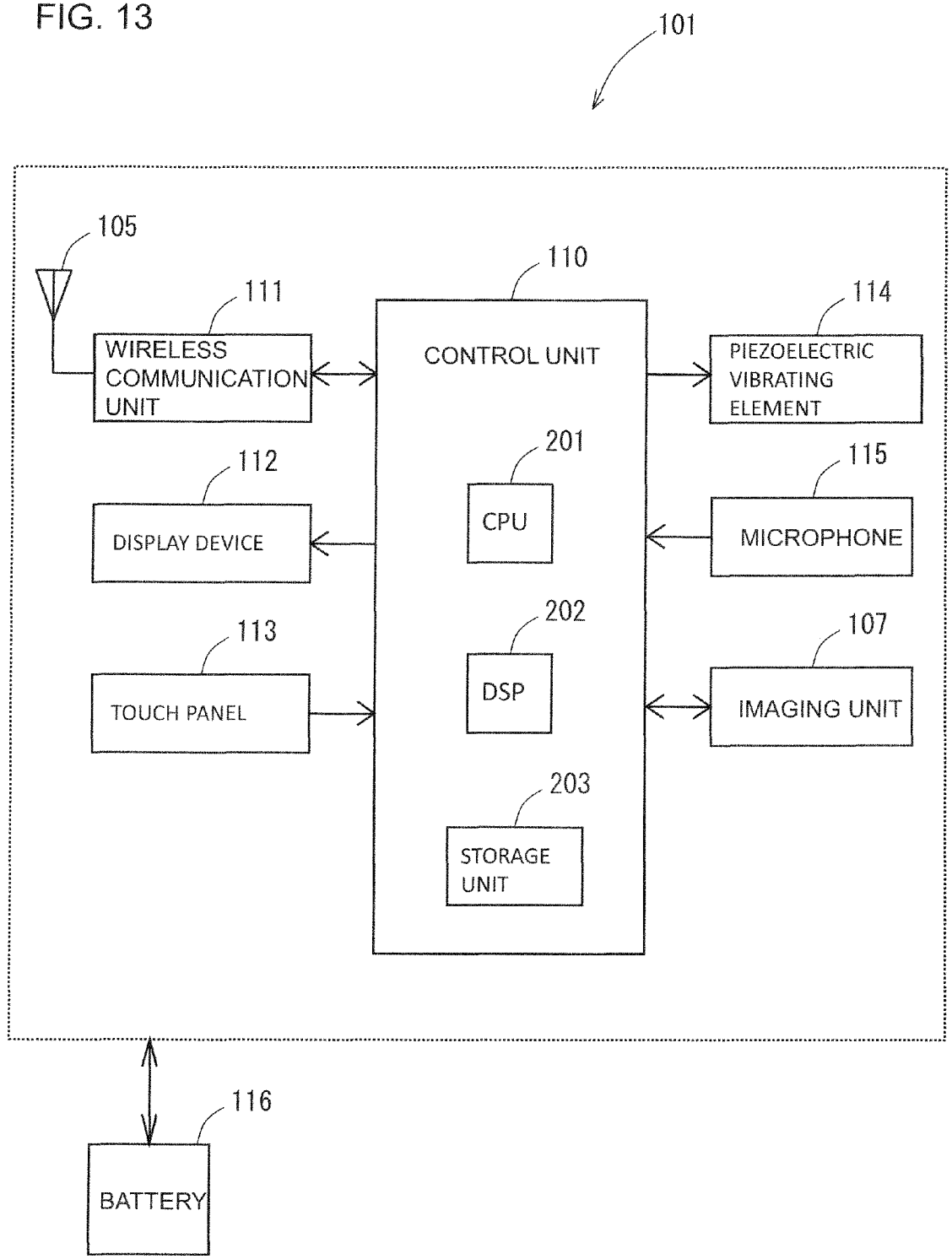
FIG. 13 is a block diagram illustrating an electrical configuration of the electronic apparatus.

FIG. 13 is a block diagram illustrating the electrical configuration of the electronic apparatus 101. As illustrated in FIG. 13, the electronic apparatus 101 includes a control unit 110, a wireless communication unit 111, a display device 112, a touch panel 113, a piezoelectric vibrating element 114, a microphone 115, an imaging unit 107, and a battery 116. These constituent elements in the electronic apparatus 101 are accommodated in the exterior body 300 of the electronic apparatus 101.

The control unit 110 includes a Central Processing Unit (CPU) 201, a Digital Signal Processor (DSP) 202, a storage unit 203, and the like. The control unit 110 manages the overall operation of the electronic apparatus 101 by controlling other constituent elements of the electronic apparatus 101. The storage unit 203 may include a Read Only Memory (ROM), a Random Access Memory (RAM), and the like. Main programs, a plurality of application programs, and the like are stored in the storage unit 203 and are control programs for controlling the electronic apparatus 101. Specifically, the control programs control respective constituent elements such as the wireless communication unit 11 and the display device 12 included in the electronic apparatus 101. Various functions of the control unit 110 can be realized by the CPU 201 and the DSP 202 executing various programs in the storage unit 203.

The wireless communication unit 111 includes antennas 105 (antennas 105a and 105b). The wireless communication unit 111 receives or transmits a communication signal from/to a mobile phone other than the electronic apparatus 101 or a communication device such as a web server connected to the Internet using an antenna 105 via a base station or the like.

In the present embodiment, the antenna 105 is included in the rear surface panel 104. However, the antenna 105 may be arranged in the exterior body 300. Since the sapphire has a low dielectric loss in a high frequency area, transparency of the high frequency wireless signal in the exterior body 300 is improved when the exterior body 300 (including first surface panel 102, the housing 103, and the rear surface side panel 104) of the electronic apparatus 101 is a sapphire member. Therefore, when the antenna 105 receiving a high frequency wireless signal is arranged in the exterior body 300, the degree of freedom of the arrangement location of the antenna 105 in the exterior body 300 is improved.

The display device 112 is, for example, a liquid crystal display or an organic EL display. As described above, various pieces of information displayed by the display device 112 are visually recognized from the outside of the electronic apparatus 101 through the display area 102a.

The touch panel 113 is, for example, a projection type electrostatic capacitance touch panel. The touch panel 113 is attached to the inner surface 171 of the first surface panel 102. The touch panel 113 includes two sheet-like electrode sensors which are arranged so as to face each other. When the user touches the display area 102a using an operator such as a finger or the like, the electrostatic capacitance of the portion facing the operator in the touch panel 113 is changed. Further, the touch panel 113 outputs an electrical signal according to the change of the electrostatic capacitance to the control unit 110. In this manner, the touch panel 113 can detect contact with respect to the display area 102a of the operator.

The piezoelectric vibrating element 114 and the microphone 115 are attached to the inner surface 171 of the first surface panel 102. The piezoelectric vibrating element 114 is vibrated by a driving voltage applied from the control unit 110. The control unit 110 generates a driving voltage based on a sound signal and applies the driving voltage to the piezoelectric vibrating element 114. The first surface panel 102 is vibrated based on the sound signal by the piezoelectric vibrating element 114 being vibrated based on the sound signal by the control unit 110. As a result, a reception sound is transmitted to the user from the first surface panel 102. The volume of the reception sound is set to a degree such that the user can appropriately hear the sound when the first surface panel 102 is set close against an ear of the user. Details of the piezoelectric vibrating element 114 and the reception sound transmitted to the user from the first surface panel 102 will be described below in detail.

Further, a case in which the reception sound is transmitted to the user from the first surface panel 102 by the piezoelectric vibrating element 114 will be described below, but a dynamic speaker that converts the electric sound signal from the control unit 110 into a sound and then outputs the sound may be adopted instead of the piezoelectric vibrating element 114. In the case of adopting the dynamic speaker, receiver holes are provided in the exterior body 300. The sound output from the dynamic speaker is output to the outside from the receiver holes provided on the exterior body 300. Since sapphire is hard as described above, a process of providing a throughhole such as a receiver hole in the exterior body 300 made of sapphire is difficult to perform. Therefore, the number of processes on the exterior body 300 for providing the receiver hole is reduced by adopting the piezoelectric vibrating element 114 in which the receiver hole is not necessary to the electronic apparatus 101. As a result, the electronic apparatus 101 can be easily produced. Further, the exterior body 300 becomes weak by receiver hole being provided. However, in a case where the piezoelectric vibrating element 114 is adopted, since the receiver hole is not necessary in the exterior body 300, the strength of the exterior body 300 can be maintained.

The microphone 115 converts vibration of the first surface panel 102 into the electrical signal and outputs the converted signal to the control unit 110. The vibration of the first surface panel 102 generates by the voice or the like of the user during communication on the phone or the like.

Further, the microphone 115 may not convert the vibration of the first surface panel 102 into the electrical signal. The microphone 115 may convert air vibration such as the voice or the like of the user directly into an electrical signal and output the converted signal in the control unit 110. In this case, a microphone hole is provided in the exterior body 300. The voice or the like of the user is incorporated in the inside of the electronic apparatus 101 from the microphone hole and input to the microphone 115.

The imaging unit 107 images a still image and a moving image. The battery 116 outputs power of the electronic apparatus 101. The power output from the battery 116 is supplied to each of the electronic components included in the control unit 110, the wireless communication unit 111, and the like included in the electronic apparatus 101.

<Details of Piezoelectric Vibrating Element>

Figure 14A:
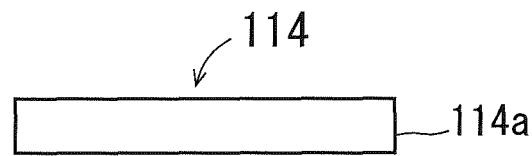
FIG. 14A is a top view illustrating a piezoelectric vibrating element.
Figure 14B:
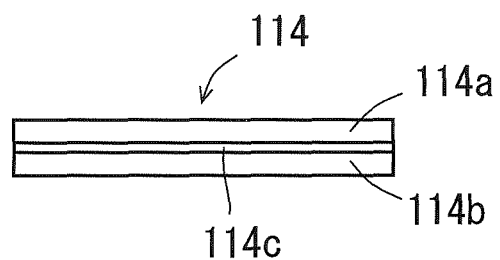
FIG. 14B is a side view illustrating the piezoelectric vibrating element.

FIGS. 14A, 14B 14C and 14D are respectively a top view and side views illustrating a structure of the piezoelectric vibrating element 114. As illustrated in FIGS. 14A and 14B, the piezoelectric vibrating element 114 has a long shape in one direction. Specifically, the piezoelectric vibrating element 114 has a long and narrow rectangular plate shape in a plan view. The piezoelectric vibrating element 114 has, for example, a bimorph structure and includes a first piezoelectric ceramic plate 114a and a second piezoelectric ceramic plate 114b which are attached to each other through a shim material 114c.

In the piezoelectric vibrating element 114, when a positive voltage is applied to the first piezoelectric ceramic plate 114a and a negative voltage is applied to the second piezoelectric ceramic plate 114b, the first piezoelectric ceramic plate 114a extends along the longitudinal direction and the second piezoelectric ceramic plate 114b contracts along the longitudinal direction. Accordingly, as illustrated in FIG. 14C, the piezoelectric vibrating element 114 is bent into a convex shape with the first piezoelectric ceramic plate 114a being outside.

In contrast, in the piezoelectric vibrating element 114, when a negative voltage is applied to the first piezoelectric ceramic plate 114a and a positive voltage is applied to the second piezoelectric ceramic plate 114b, the first piezoelectric ceramic plate 114a contracts along the longitudinal direction and the second piezoelectric ceramic plate 114b extends along the longitudinal direction. Accordingly, as illustrated in FIG. 14D, the piezoelectric vibrating element 114 is bent into a convex shape with the second piezoelectric ceramic plate 114b being outside.

Figure 14C:
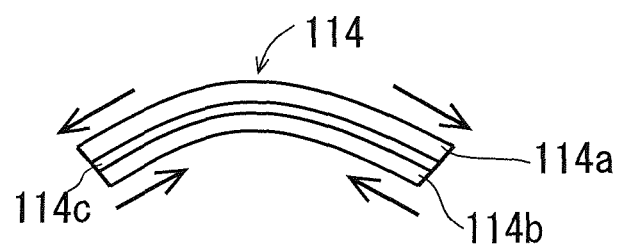
FIGS. 14C is a side view illustrating the piezoelectric vibrating element in a state of being operated.
Figure 14D:
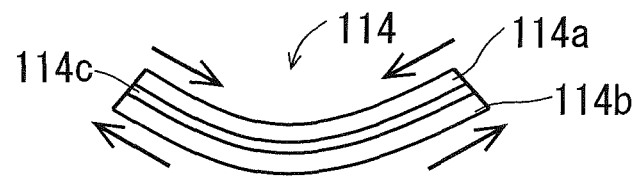
FIGS. 14D is a side view illustrating the piezoelectric vibrating element in a state of being operated.

The piezoelectric vibrating element 114 vibrates while being bent by alternatively taking the state of FIG. 14C and the state of FIG. 14D. The control unit 110 allows the piezoelectric vibrating element 114 to vibrate while being bent by applying an AC voltage in which the positive voltage and the negative voltage alternatively appear at an area between the first piezoelectric ceramic plate 114a and the second piezoelectric ceramic plate 114b.

FIGS. 14A to 14D illustrates one structure made of the first piezoelectric ceramic plate 114a and the second piezoelectric ceramic plate 114b which are bonded to each other by interposing the shim material 114c therebetween in the piezoelectric vibrating element 114. However, a plurality of the structures may be laminated to each other.

<Regarding Generation of Reception Sound Due to>Vibration of Piezoelectric Vibrating Element In the present embodiment, an air conduction sound and a conduction sound are transmitted to the user from the first surface panel 102 via the vibration of the piezoelectric vibrating element 114. That is, the vibration of the piezoelectric vibrating element 114 is transmitted to the first surface panel 102 so that the air conduction sound and the conduction sound are transmitted to the user from the first surface panel 102.

Here, the term "air conduction sound" means a sound recognized in a human brain by the vibration of an eardrum due to a sound wave (or air vibration) which enters an external auditory meatus hole (a so-called also known as an "ear hole"). On the other hand, the term "conduction sound" is a sound recognized in a human brain by the vibration of the eardrum due to the vibration of an auricle transmitted to the eardrum. Hereinafter, the air conduction sound and the conduction sound will be described in detail.

Figure 15:
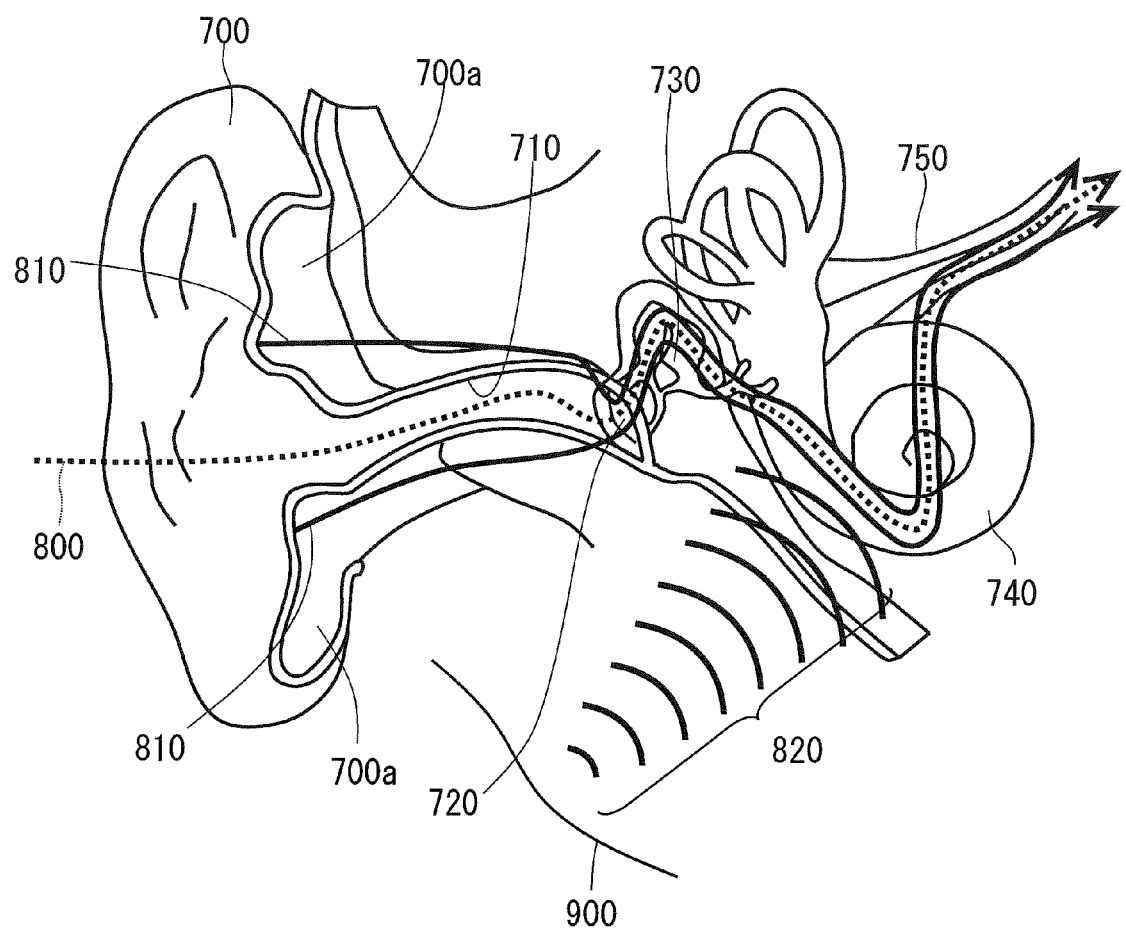
FIG. 15 is a view illustrating a structure of an ear of the user of an electronic apparatus.

FIG. 15 is a view for describing the air conduction sound and the conduction sound. FIG. 15 illustrates a structure of an ear of the user of the electronic apparatus 101. In FIG. 15, a wavy line 800 indicates a conduction path of a sound signal (sound information) of the air conduction sound. A solid line 810 indicates the conduction path of the sound signal of the conduction sound.

When the piezoelectric vibrating element 114 mounted to the first surface panel 102 vibrates based on the electric sound signal indicating the reception sound, the first surface panel 102 vibrates and a sound wave is outputted from the first surface panel 102. When the user moves the first surface panel 102 of the electronic apparatus 101 close to an auricle 700 of the user by holding the electronic apparatus 101 in a hand or the first surface panel 102 of the electronic apparatus 101 is put to the auricle 700 of the user, the sound wave output from the first surface panel 102 enters an external auditory meatus hole 710. The sound wave from the first surface panel 102 enters in the external auditory meatus hole 710 and the eardrum 720 vibrates. The vibration of the eardrum 720 is transmitted to an auditory ossicle 730 and the auditory ossicle 730 vibrates. In addition, the vibration of the auditory ossicle 730 is transmitted to a cochlea 740 and is converted into an electrical signal in the cochlea 740. The electrical signal is transmitted to the brain by passing through an acoustic nerve 750 and the reception sound is recognized in the brain. In this manner, the air conduction sound is transmitted from the first surface panel 102 to the user.

When the user puts the first surface panel 102 of the electronic apparatus 101 to the auricle 700 of the user by holding the electronic apparatus 101 in a hand, the auricle 700 is vibrated by the first surface panel 102 which is vibrated by the piezoelectric vibrating element 114. The vibration of the auricle 700 is transmitted to the eardrum 720, and thus the eardrum 720 vibrates. The vibration of the eardrum 720 is transmitted to the auditory ossicle 730, and thus the auditory ossicle 730 vibrates. The vibration of the auditory ossicle 730 is transmitted to the cochlea 740 and is converted into an electrical signal in the cochlea 740. The electrical signal is transmitted to the brain by passing through the acoustic nerve 750 and the reception sound is recognized in the brain. In this manner, the conduction sound is transmitted from the first surface panel 102 to the user. FIG. 153 illustrates an auricular cartilage 700a in the inside of the auricle 700.

In addition, the conduction sound herein is different from a bone conduction sound (also referred to as a "bone conduction sound"). The bone conduction sound is a sound recognized in a human brain by the vibration of the skull and direct stimulation of the inner ear such as the cochlea caused by the vibration of the skull. In FIG. 15, in a case of vibrating the jawbone 900, the transmission path of the sound signal while the bone conduction sound is recognized in the brain is indicated with a plurality of arcs 820.

In this manner, in the electronic apparatus 101 according to the present embodiment, the air conduction sound and the conduction sound can be transmitted from the first surface panel 102 to the user of the electronic apparatus 101 due to the vibration of the first surface panel 102 through the vibration of the piezoelectric vibrating element 114. Since the user can hear a sound when the user puts the first surface panel 102 to the auricle 700 of the user, the communication using a telephone can be performed without concerning the position of the electronic apparatus 101 put against an ear so much. In addition, the user can hear the conduction sound due to the vibration of the auricle, the electronic apparatus 101 makes it easy for the user to hear the sound even when there is a large amount of the ambient noise. Accordingly, the user can appropriately perform communication using a telephone even when there is a large amount of the ambient noise.

In addition, even in a state in which earplugs or earphones are fixed to the ears of the user, the reception sound from the electronic apparatus 101 can be recognized by putting the first surface panel 102 to the auricle 700. Further, even in the state in which headphones are fixed to the ears of the user, the reception sound from the electronic apparatus 101 can be recognized by putting the first surface panel 102 to the headphones.

In the above-described embodiment, a case of a mobile phone case to which the present invention is applied is described as an embodiment. However, the present invention can be applied to an electronic apparatus other than the mobile phone. For example, embodiments may be applicable to tablets, e-Readers, digital cameras, electronic game machines, digital music players, personal digital assistants (PDAs), personal handy phone system (PHS), laptop computers, portable TV's, Global Positioning Systems (GPS's) or navigation systems, machining tools, pedometers, health equipment such as weight scales, display monitors, smartwatches, wearables, and the like. In addition, the present invention is not limited to the above-described embodiments, and various modifications and changes may be made in the range not departing from the scope of the present invention.

What is claimed is:

1. A sapphire structure with a metal substructure, comprising:
   a sapphire structure that includes a flat surface and a concave portion on the flat surface; and
   a metal substructure in the concave portion, which is bonded to an inner surface of the concave portion and includes a surface portion that is substantially flush with the flat surface of the sapphire structure; and
   wherein the inner surface of the concave portion of the sapphire structure comprises:
   a bottom surface,
   a side surface,
   and a corner between the bottom surface and the side surface, wherein the corner is inclined with respect to the bottom surface and the side surface.

2. The sapphire structure with a metal substructure according to claim 1, wherein the metal substructure contains silver as a main component.

3. The sapphire structure with a metal substructure according to claim 2, wherein the metal substructure contains silicon dioxide.

4. The sapphire structure with a metal substructure according to claim 2, wherein the metal substructure contains copper.

5. The sapphire structure with a metal substructure according to claim 2, wherein the metal substructure contains titanium.

6. The sapphire structure with a metal substructure according to claim 5, wherein the metal substructure comprises a bonding layer bonded to the inner surface of the concave portion of the sapphire structure, the bonding layer containing titanium as a main component.

7. The sapphire structure with a metal substructure according to claim 1, wherein the sapphire structure is a plate-like body and further comprises:
   the flat surface as a first surface,
   a second surface on the opposite side of the plate-like body from the first surface,
   and a through-hole with openings on a bottom surface of the concave portion of the sapphire structure and the second surface.

8. The sapphire structure with a metal substructure according to claim 7, further comprising a via conductor with metal as a main component, which fills the through-hole.

9. The sapphire structure with a metal substructure according to claim 1, wherein an arithmetic average roughness (Ra) of the surface portion of the metal substructure is greater than the arithmetic average roughness (Ra) of the flat surface of the sapphire structure.

10. The sapphire structure with a metal substructure according to claim 1, wherein the arithmetic average roughness of the flat surface of the sapphire structure is 10 nm or lower.

11. The sapphire structure with a metal substructure according to claim 10, wherein the arithmetic average roughness of the flat surface of the sapphire structure is 1 nm or lower.

12. A method for producing a sapphire structure with a metal substructure according to claim 1, comprising:
   forming a concave portion on a flat surface of a sapphire structure;
   applying metal paste that contains metal particles and a solvent to the inside of the concave portion;
   forming a metal substructure in the concave portion bonded to an inner surface of the concave portion by heating the sapphire structure and metal paste to evaporate the solvent contained in the metal paste and to bind the metal particles to each other; and
   making at least part of a surface of the metal substructure substantially flush with the flat surface by polishing the flat surface and the surface of the metal substructure at the same time.

13. The method for producing a sapphire structure with a metal substructure according to claim 12,
   wherein the metal particles contain silver as a main component, and
   the metal paste contains silicon dioxide.

14. The method for producing a sapphire structure with a metal substructure according to claim 13, wherein the metal paste further contains copper.

15. The method for producing a sapphire structure with a metal substructure according to claim 13, wherein the metal paste further contains titanium.

16. The method for producing a sapphire structure with a metal substructure according to claim 12,
   wherein, in the applying, the surface of the metal substructure disposed in the concave portion is closer to a bottom surface of the concave portion than the flat surface, and
   the polishing includes:
   a first polishing in which only the flat surface is polished, and
   a second polishing in which the flat surface and the metal substructure are polished at the same time.

17. An electronic apparatus, comprising:
   a device; and
   an exterior body that houses the device and includes a sapphire structure with a metal substructure according to claim 1.

18. An electronic apparatus, comprising:
a device; and
a mounting body on which the device is disposed, the mounting body including a sapphire structure with a metal substructure according to claim 1.

19. An exterior body used for an electronic apparatus comprising a sapphire structure with a metal substructure according to claim 1.

\* \* \* \* \*